US012757378B2

(12) United States Patent
Eom et al.

(10) Patent No.: US 12,757,378 B2
(45) Date of Patent: Oct. 6, 2026

(54) SEMICONDUCTOR MEMORY DEVICE

(71) Applicant: Samsung Electronics Co., Ltd., Suwon-si (KR)

(72) Inventors: Taeyoung Eom, Suwon-si (KR); Hyungmin Ko, Suwon-si (KR); Boryeon Bae, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 306 days.

(21) Appl. No.: 18/432,290

(22) Filed: Feb. 5, 2024

(65) Prior Publication Data

US 2024/0349484 A1 Oct. 17, 2024

(30) Foreign Application Priority Data

Apr. 13, 2023 (KR) ........................ 10-2023-0048562

(51) Int. Cl.
*H10B 12/00* (2023.01)

(52) U.S. Cl.
CPC ........... *H10B 12/315* (2023.02); *H10B 12/02* (2023.02); *H10B 12/482* (2023.02); *H10B 12/50* (2023.02)

(58) Field of Classification Search
CPC .... H10B 12/315; H10B 12/02; H10B 12/482; H10B 12/50; H10B 12/31; H10B 12/03; H10B 12/05; H10B 12/485
See application file for complete search history.

(56) References Cited

U.S. PATENT DOCUMENTS

| | | | | |
|---|---|---|---|---|
| 9,012,321 | B1 | 4/2015 | Kim et al. | |
| 9,515,022 | B2 | 12/2016 | Kwon et al. | |
| 10,748,909 | B2 | 8/2020 | Ma et al. | |
| 11,411,004 | B2 | 8/2022 | Lee et al. | |
| 2020/0402981 | A1 * | 12/2020 | Kim ................... | H10B 12/0335 |
| 2021/0296237 | A1 * | 9/2021 | Kim ..................... | H10B 12/315 |
| 2022/0102528 | A1 | 3/2022 | Kim et al. | |
| 2022/0115377 | A1 | 4/2022 | Kim et al. | |
| 2022/0173107 | A1 | 6/2022 | Moon et al. | |
| 2024/0260256 | A1 | 8/2024 | Eom et al. | |

FOREIGN PATENT DOCUMENTS

KR 10-2024-0119606 A 8/2024

* cited by examiner

*Primary Examiner* — Tucker J Wright
(74) *Attorney, Agent, or Firm* — Harness, Dickey & Pierce, P.L.C.

(57) ABSTRACT

A semiconductor memory device includes a substrate including a memory cell region, a first bit line on a center region of the memory cell region, a first landing pad on the first bit line, a first bit line capping pattern between the first bit line and first landing pad, a second bit line on an edge region of the memory cell region, a second landing pad on the second bit line, and a second bit line capping pattern between the second bit line and the second landing pad. The first and second bit line capping patterns vertically overlap the first and second landing pads, respectively. A distance from the top of the first bit line capping pattern from the top of the first landing pad is greater than a distance from the top of the second bit line capping pattern to from the top of the second landing pad.

20 Claims, 14 Drawing Sheets

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2023-0048562, filed on Apr. 13, 2023, in the Korean Intellectual Property Office, the entire contents of which are hereby incorporated by reference.

BACKGROUND

The present disclosure relates to semiconductor memory devices.

Semiconductor devices have an important role in an electronic industry because of their small size, multi-functionality, and/or low fabrication cost. Semiconductor devices may be categorized as one of semiconductor memory devices storing logic data, semiconductor logic devices processing operations of logic data, and hybrid semiconductor devices having both memory and logic elements.

Recently, high speed and low consumption of electronic products require that semiconductor devices embedded in the electronic products should have high operating speed and/or lower operating voltage. However, an increasing integration of semiconductor devices induces an increase in process difficulty and failure of semiconductor device production. As a result, an increase in integration of semiconductor devices may reduce production yields and characteristics of semiconductor devices. Therefore, various studies have been conducted for enhancing characteristics and production yields of semiconductor devices.

SUMMARY

Some example embodiments of the present disclosure provide structures of semiconductor memory devices with increased reliability and manufacturing methods thereof.

The problems to be solved by the present disclosure is not limited to the above-mentioned problems, and other problems not mentioned will be clearly understood by those skilled in the art from the following description.

A semiconductor memory device according to an example embodiment of the present disclosure includes a substrate including a memory cell region, the memory cell region including a cell center region and a cell edge region surrounding the cell center region, a first bit line on the cell center region, a first landing pad on the first bit line, a first bit line capping pattern between the first bit line and the first landing pad, a second bit line on the cell edge region, a second landing pad on the second bit line, and a second bit line capping pattern between the second bit line and the second landing pad, wherein the first bit line capping pattern vertically overlaps the first landing pad, the second bit line capping pattern vertically overlaps the second landing, and a first distance from an upper surface of the first bit line capping pattern to an upper surface of the first landing pad is greater than a second distance from an upper surface of the second bit line capping pattern to an upper surface of the second landing pad.

A semiconductor memory device according to an example embodiment of the present disclosure includes a substrate including a memory cell region, the memory cell region including a cell center region and a cell edge region surrounding the cell center region, a first bit line on the cell center region, a first landing pad on the first bit line, a first bit line capping pattern between the first bit line and the first landing pad, a second bit line on the cell edge region, a second landing pad on the second bit line, and a second bit line capping pattern between the second bit line and the second landing pad, wherein the first landing pad includes a first lower metal pattern and a first upper metal pattern on the first lower metal pattern, the second landing pad includes a second lower metal pattern and a second upper metal pattern on the second lower metal pattern, an upper portion of the first lower metal pattern vertically overlaps the first bit line capping pattern, an upper portion of the second lower metal pattern vertically overlaps the second bit line capping pattern, and a first thickness of the upper portion of the first lower metal pattern is greater than a second thickness of the upper portion of the second lower metal pattern.

A semiconductor memory device according to an example embodiment of the present disclosure includes a substrate including a memory cell region, a peripheral region, and a boundary region, the memory cell region including a cell center region and a cell edge region surrounding the cell center region, the peripheral region surrounding the memory cell region, and the boundary region being between the peripheral region and the cell edge region, a first bit line on the cell center region, a first landing pad on the first bit line, the first landing pad including a first lower metal pattern and a first upper metal pattern on the first lower metal pattern, a first bit line capping pattern between the first bit line and the first landing pad, a second bit line on the cell edge region, a second landing pad on the second bit line, the second landing pad including a second lower metal pattern and a second upper metal pattern on the second lower metal pattern, a second bit line capping pattern between the second bit line and the second landing pad, a dummy metal-containing pattern on the boundary region, a dummy capping pattern on the dummy metal-containing pattern, a third lower metal pattern on a side surface of the dummy capping pattern, and a third upper metal pattern on an upper surface of the dummy capping pattern, wherein the first upper metal pattern, the second upper metal pattern, and the third upper metal pattern includes a same metal material, the first upper metal pattern is vertically spaced apart from the first bit line capping pattern with the first lower metal pattern interposed therebetween, the second upper metal pattern is vertically spaced apart from the second bit line capping pattern with the second lower metal pattern interposed therebetween, and the third upper metal pattern is in contact with the dummy capping pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Hereinafter, to explain the present disclosure in more detail, some example embodiments according to the present disclosure will be described in more detail with reference to the accompanying drawings. A peripheral block PB may include various peripheral circuits desired for an operation of a cell circuit, and the peripheral circuits may be electrically connected to the cell circuit.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
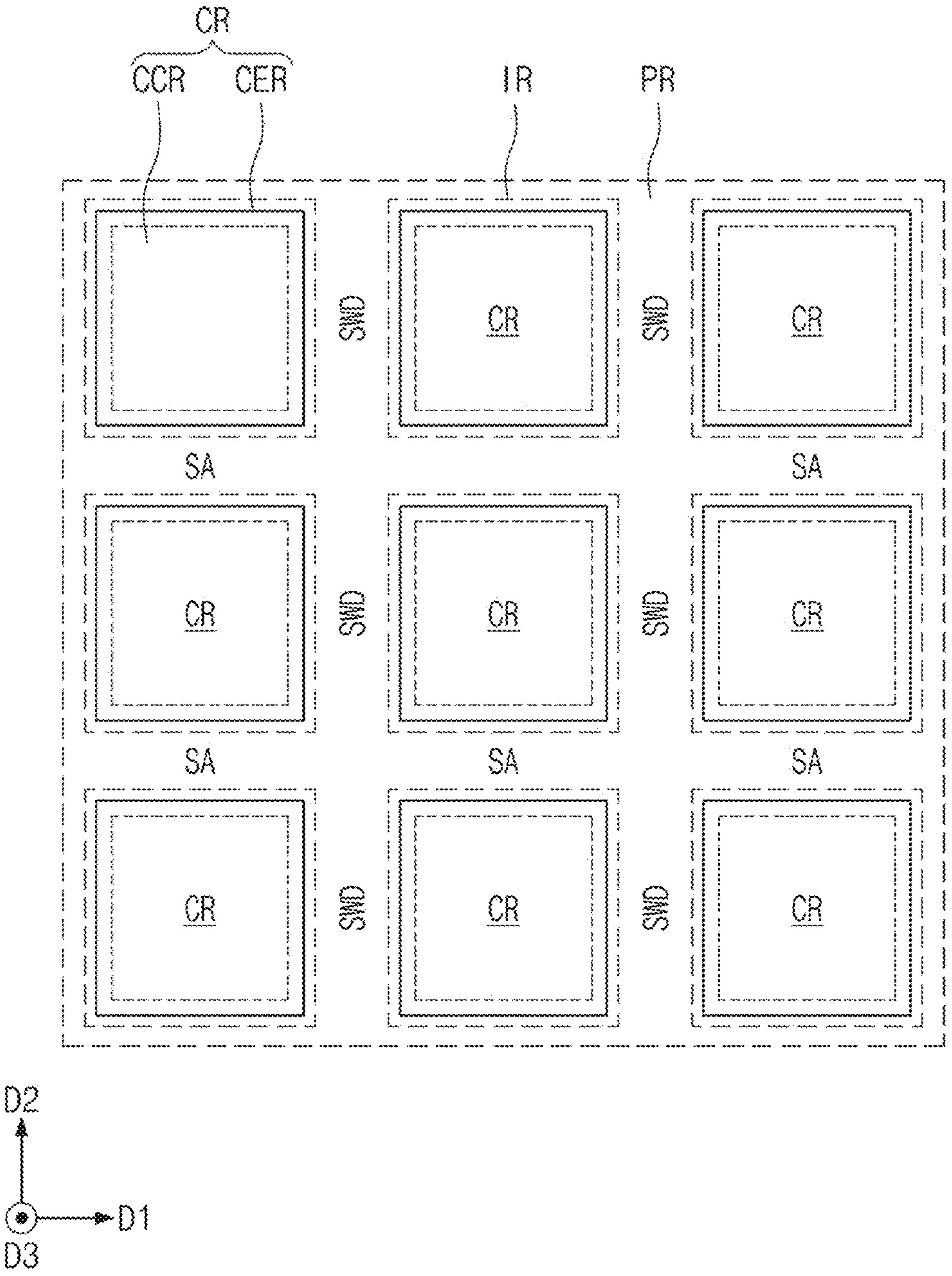
FIG. 1 is a block diagram illustrating a semiconductor memory device according to an example embodiment of the present disclosure.

FIG. 1 is a block diagram illustrating a semiconductor memory device according to an example embodiment of the present disclosure. In some example embodiments, the semiconductor memory device may be a DRAM memory device. Referring to FIG. 1, a semiconductor memory device may include a memory cell region CR, a boundary region IR, and a peripheral region PR. The memory cell region CR may have a rectangular shape when viewed in a plan view. The peripheral region PR may surround the memory cell region CR, and a boundary region IR may be interposed therebetween. The peripheral region PR may be a core/peripheral region.

The memory cell region CR may include a cell center region CCR and a cell edge region CER surrounding the cell center region CCR. The cell edge region CER may be disposed between the cell center region CCR and the boundary region IR. An area occupied by the cell center region CCR in the memory cell region CR may be larger than that of the cell edge region CER. Memory cell circuits such as memory integrated circuits may be provided in the memory cell region CR. Peripheral circuits such as transistors may be provided in the peripheral region PR. For example, the peripheral circuits may include sense amplifier circuits SA and sub-word line driver circuits SWD. The peripheral circuits may further include power supply and ground driver circuits for driving a sense amplifier. The boundary region IR may distinguish the memory cell region CR and the peripheral region PR.

Figure 2:
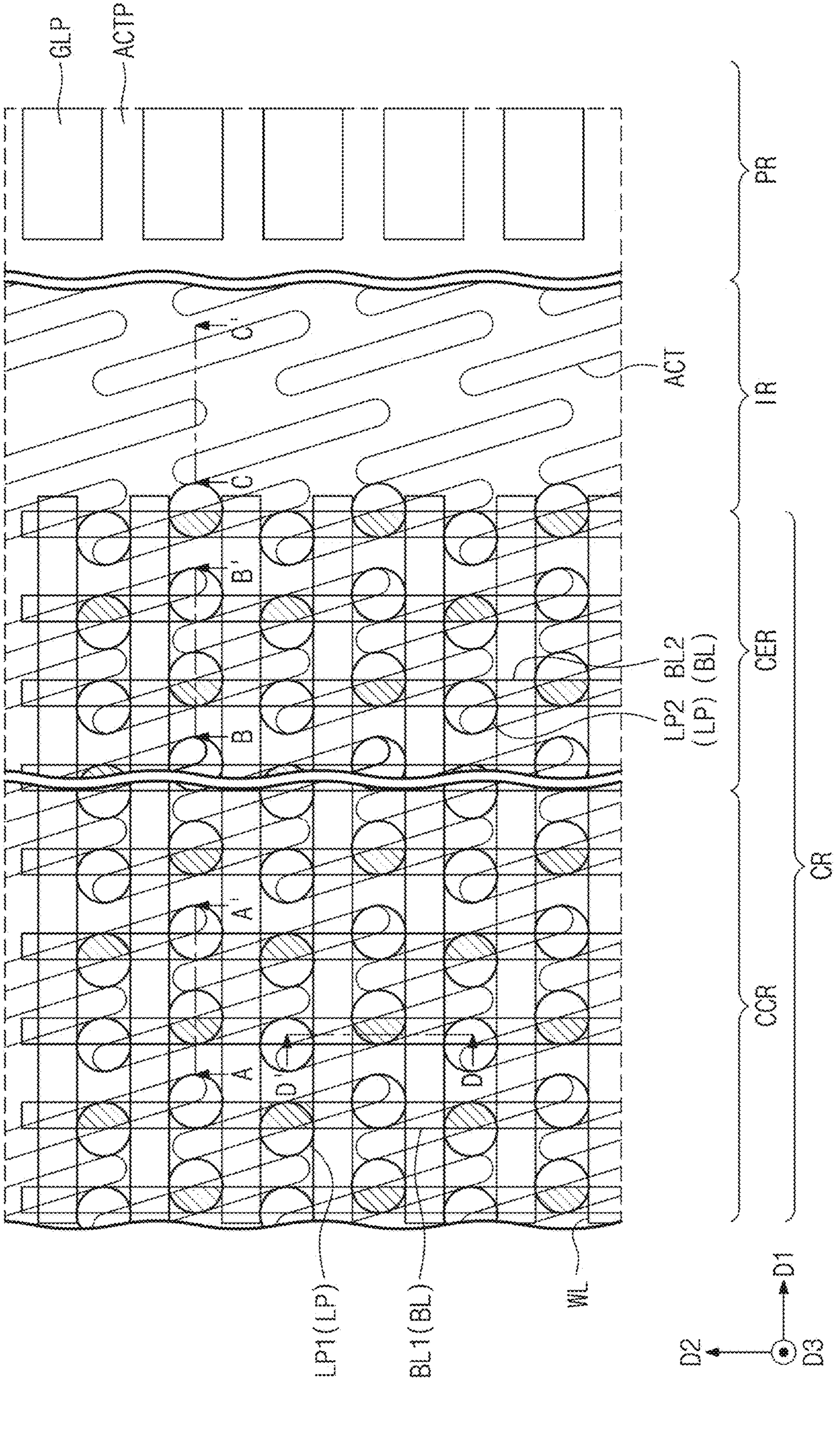
FIG. 2 is a plan view illustrating a semiconductor memory device according to an example embodiment of the present disclosure.
Figure 3A:
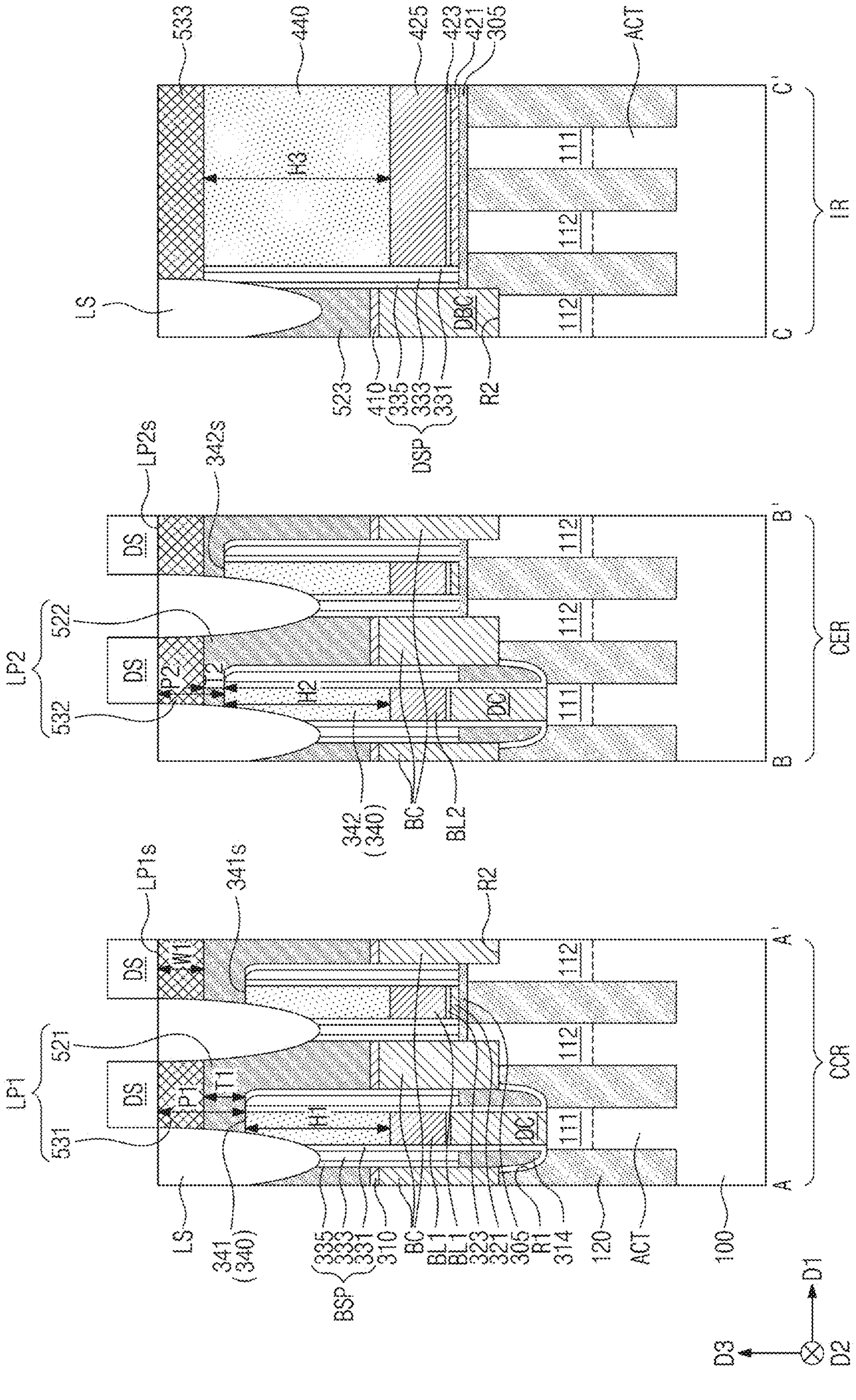
FIG. 3A is a cross-sectional view taken along lines A-A', B-B', and C-C' of FIG. 2.
Figure 3B:
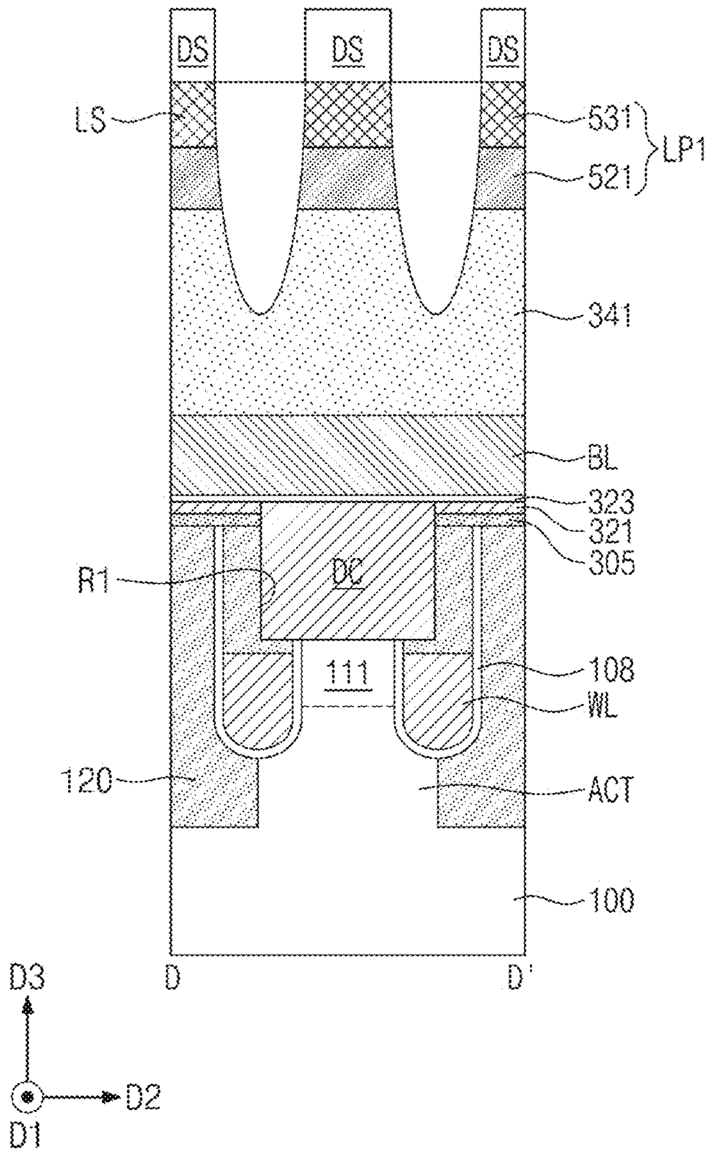
FIG. 3B is a cross-sectional view taken along line D-D' of FIG. 2.

FIG. 2 is a plan view illustrating a semiconductor memory device according to an example embodiment of the present disclosure. FIG. 3A is a cross-sectional view taken along lines A-A', B-B', and C-C' of FIG. 2. FIG. 3B is a cross-sectional view taken along line D-D' of FIG. 2.

Referring to FIGS. 2, 3A, and 3B, a semiconductor substrate 100 including a memory cell region CR, a boundary region IR, and a peripheral region PR may be provided.

The semiconductor substrate 100 may be, for example, a silicon substrate, a germanium substrate, or a silicon-germanium substrate.

Cell active patterns ACT may be disposed on at least a portion of the memory cell region CR and the boundary region IR of the semiconductor substrate 100. The cell active patterns ACT may be spaced apart from each other in first and second directions D1 and D2. The first direction D1 and the second direction D2 may be directions that are parallel to an upper surface of the semiconductor substrate 100 and cross each other (e.g., orthogonal to each other). The cell active patterns ACT may have a bar shape extending in one direction parallel to the upper surface of the semiconductor substrate 100 and crossing the first direction D1 and the second direction D2. An end of one of the cell active patterns ACT may be arranged to be adjacent to a center of another cell active pattern ACT neighboring in the first direction D1. Each of the cell active patterns ACT may be a portion of the semiconductor substrate 100 protruding from the semiconductor substrate 100 in a third direction D3 perpendicular to the upper surface of the semiconductor substrate 100.

Device isolation patterns 120 may be disposed in the cell center region CCR, the cell edge region CER, and the boundary region IR of the semiconductor substrate 100. The device isolation patterns 120 may also be disposed in the boundary region IR. The device isolation patterns 120 may be disposed in the semiconductor substrate 100 to define the cell active patterns ACT. The device isolation patterns 120 may include, for example, silicon oxide, silicon nitride, and/or silicon oxynitride.

Word lines WL may cross the cell active patterns ACT and the device isolation patterns 120 on the memory cell region CR. The word lines WL may be disposed in grooves formed in the cell active patterns ACT and the device isolation patterns 120. The word lines WL may extend in the first direction D1 and may be spaced apart from each other in the second direction D2. The word lines WL may be buried in the semiconductor substrate 100.

Impurity regions may be provided in the cell active patterns ACT. The impurity regions may include first impurity regions 111 and second impurity regions 112. The second impurity regions 112 may be provided in both edge regions of each of the cell active patterns ACT, and each of the first impurity regions 111 may be interposed between the second impurity regions 112 in each of the cell active patterns ACT. The first impurity regions 111 may include impurities of the same conductivity type (e.g., N-type) as the second impurity regions 112.

A buffer pattern 305 may be disposed on the cell center region CCR, the cell edge region CER, and the boundary region IR of the semiconductor substrate 100. The buffer pattern 305 may cover the cell active patterns ACT, the device isolation patterns 120, and the word lines WL. The buffer pattern 305 may include, for example, silicon oxide, silicon nitride, and/or silicon oxynitride.

Bit lines BL may be disposed on the cell center region CCR and the cell edge region CER. The bit lines BL may be provided in plural and may be spaced apart from each other in the first direction D1. Each of the bit lines BL may extend in the second direction D2. For example, the bit line BL may include at least one of tungsten, rubidium, molybdenum, titanium, or a combination thereof. The bit lines BL may include first bit lines BL1 disposed on the cell center region CCR and second bit lines BL2 disposed on the cell edge region CER. At least one gate line pattern GLP may be disposed on the peripheral region PR. The gate line pattern GLP may be disposed on the peripheral active pattern ACTP of the peripheral region PR. Although FIG. 2 illustrates that at least the gate line pattern GLP extends in the first direction D1 and has a substantially constant width in the second direction D2, example embodiments are not limited thereto. For example, each of the gate line patterns GLP may have various widths or may be various, and may have curves or may extend in various directions. In some example embodiments, the gate line pattern GLP may be disposed at the same level as the bit line BL. The gate line pattern GLP and the bit line BL may be formed of the same material, or at least a portion thereof may be formed of the same material.

A bit line contact DC may be provided on each of the active patterns AP, or may be provided in plural. The bit line contacts DC may be respectively connected to the first impurity regions 111 in the active patterns AP. The bit line contacts DC may be spaced apart from each other in the first and second directions D1 and D2 as shown in FIG. 2. The bit line contacts DC may be interposed between the active patterns AP and the bit lines BL, respectively. Each of the bit line contacts DC may electrically connect a corresponding bit line BL among the bit lines BL and a corresponding first impurity region 111. The bit line contact DC may include, for example, polysilicon. The bit line contacts DC may be disposed in first recess regions R1, respectively. The first recess regions R1 may be provided on upper portions of the active patterns AP and on an upper portion of the device isolation pattern 120 adjacent to the upper portions of the active patterns AP. The first recess regions R1 may be spaced apart from each other in the first and second directions D1 and D2.

A polysilicon pattern 321 may be provided between the bit line BL and the buffer pattern 305 and between the bit line contacts DC adjacent to each other in the first direction D1. The polysilicon pattern 321 may be provided in plural. An upper surface of the polysilicon pattern 321 may be positioned at substantially the same height as an upper surface of the bit line contact DC, and may be coplanar. The polysilicon pattern 321 may include polysilicon.

A first ohmic pattern 323 may be provided between the bit line BL and the bit line contact DC and between the bit line BL and the polysilicon pattern 321. The first ohmic patterns 323 may extend along the bit lines BL in the second direction D2 and may be spaced apart from each other in the first direction D1. The first ohmic patterns 323 may include metal silicide. According to some example embodiments, a first barrier pattern may be further interposed between the first ohmic pattern 323 and the bit line BL. The first barrier pattern may include, for example, a conductive metal nitride, and may include, for example, at least one of tungsten oxide, rubidium oxide, molybdenum oxide, titanium oxide, or a combination thereof.

Bit line capping patterns 340 may be provided on upper surfaces of the bit lines BL, respectively. The bit line capping patterns 340 may extend along the corresponding bit line BL in the second direction D2 and may be spaced apart from each other in the first direction D1. The bit line capping patterns 340 may include silicon nitride.

The bit line capping patterns 340 may include a first bit line capping pattern 341 and a second bit line capping pattern 342. The first bit line capping pattern 341 may be provided on the first bit line BL1 and may vertically overlap the first bit line BL1. The second bit line capping pattern 342 may be provided on the second bit line BL2 and vertically overlap the second bit line BL2. The first bit line capping pattern 341 may have a first height H1, and the second bit line capping pattern 342 may have a second height H2 greater than the first height H1. For example, the first height H1 may be 45 nm and the second height H2 may be 51 nm. A difference between the first height H1 and the second height H2 may be greater than 0 and less than 10 nm.

A dummy metal-containing pattern 425 may be disposed on the boundary region IR. The dummy metal-containing pattern 425 may be positioned at the same level as the bit line BL of the cell region CR. The dummy metal-containing pattern 425 may be formed of the same material as the bit line BL.

A dummy polysilicon pattern 421 may be interposed between the dummy metal-containing pattern 425 and the buffer pattern 305 on the boundary region IR. The dummy polysilicon pattern 421 may include polysilicon.

A dummy ohmic pattern 423 may be provided between the dummy metal-containing pattern 425 and the dummy polysilicon pattern 421. The dummy ohmic pattern 423 may include the same material as the first ohmic pattern 323. According to some example embodiments, the first dummy barrier pattern may be further interposed between the dummy ohmic pattern 423 and the dummy metal-containing pattern 425. The first dummy barrier pattern may include the same material as the first barrier pattern.

A dummy capping pattern 440 may be provided on the dummy metal-containing pattern 425. The dummy capping pattern 440 may include the same insulating material as the first bit line capping pattern 341 and the second bit line capping pattern 342. The dummy capping pattern 440 may have a third height H3, and the third height H3 may be greater than the first height H1 and the second height H2. The dummy capping pattern 440 may vertically overlap the dummy metal-containing pattern 425. For example, the third height H3 may be 55 nm, and a difference between the third height H3 and the second height H2 may be greater than 0 and less than 10 nm.

A bit line spacer BSP may be provided on and cover the side surfaces of the bit line BL and the bit line capping pattern 340 on the cell region CR. The dummy spacer DSP may be provided on and cover side surfaces of the dummy metal-containing pattern 425 and the dummy capping pattern 440 on the boundary region IR.

The bit line spacer BSP and the dummy spacer DSP may each include a first sub-spacer 331, a second sub-spacer 333, and a third sub-spacer 335. The first sub-spacer 331 and the third sub-spacer 335 may be spaced apart from each other, and a second sub-spacer 333 may be interposed therebetween.

The first sub-spacer 331 of the bit line spacer BSP may partially fill the first recess region R1. For example, the first sub-spacer 331 may conformally cover an inner surface of the first recess region R1 and a side surface of the bit line contact DC. Each of the first sub-spacer 331, the second sub-spacer 333, and the third sub-spacer 335 may independently include one of silicon oxide, silicon nitride, silicon oxynitride, and silicon oxide carbide (SiOC). For example, the first sub-spacer 331 and the third sub-spacer 335 may include the same material, for example, silicon oxide. In this case, the second sub-spacer 333 may be an air gap. In some example embodiments, the first sub-spacer 331 may have a material having etching selectivity to the second sub-spacer 333. In this case, the first sub-spacer 331 may include silicon nitride, the second sub-spacer 333 may include silicon oxide, and the third sub-spacer 335 may include silicon nitride. In some example embodiments, the first sub-spacer 331 may include silicon oxide, the second sub-spacer 333 may include silicon nitride, and the third sub-spacer 335 may include silicon oxide.

A buried insulating pattern 314 may fill the remainder of the first recess region R1. For example, the first sub-spacer 331 may include silicon oxide, and the buried insulating pattern 314 may include silicon nitride.

A storage node contact BC may be provided between neighboring bit lines BL. The storage node contact BC may be provided in plural, and the storage node contacts BC may be spaced apart from each other in the first and second directions D1 and D2. Although not shown, the storage node contacts BC may be spaced apart from each other in the first direction D1 by fence patterns (not shown) on the word lines WL. The fence patterns may include, for example, silicon nitride.

The storage node contact BC may fill the second recess region R2 provided on the second impurity region 112 in the active pattern AP. The storage node contact BC may be electrically connected to the second impurity region 112. The storage node contact BC may include at least one of polysilicon doped or undoped with impurities, a metal material, or a combination thereof.

A dummy storage node contact DBC may be provided on the boundary region IR. The dummy storage node contact DBC may be provided between the dummy metal-containing pattern 425 and a bit line (not shown) in the first direction D1. The dummy storage node contact DBC may include the same material as the storage node contact BC.

A landing pad LP may be provided on the storage node contact BC. The landing pad LP may be electrically connected to a corresponding storage node contact BC. The landing pad LP may cover an upper surface of the bit line capping pattern 340. An upper surface of each of the landing pads LP may have a circle or a shape close to a circle. The landing pads LP may be disposed in a honeycomb shape arranged in a zigzag pattern in the first direction D1 or the second direction D2 when viewed in a plan view.

The landing pads LP may be provided in plural, and may include a first landing pad LP1 on the cell center region CCR and a second landing pad LP2 on the cell edge region CER. The first landing pad LP1 may include a first lower metal pattern 521 and a first upper metal pattern 531 on the first lower metal pattern 521. The second landing pad LP2 may include a second lower metal pattern 522 and a second upper metal pattern 532 on the second lower metal pattern 522.

The first lower metal pattern 521 and the second lower metal pattern 522 may include the same metal material. For example, the first lower metal pattern 521 and the second lower metal pattern 522 may include titanium (Ti) or titanium (Ti) and titanium nitride (TiN). The first upper metal pattern 531 may include a different metal material than the first lower metal pattern 521, and the second upper metal pattern 532 may include a different metal material than the second lower metal pattern 522. The first upper metal pattern 531 and the second upper metal pattern 532 may include the same metal material. For example, the first upper metal pattern 531 and the second upper metal pattern 532 may include tungsten (W). The first lower metal pattern 521 and the first upper metal pattern 531 may be in contact with each other, and a boundary surface may be distinguished therebetween. The second lower metal pattern 522 and the second upper metal pattern 532 may be in contact with each other, and a boundary surface may be distinguished therebetween.

The first lower metal pattern 521 may be provided on the storage node contact BC on the cell center region CCR. The second lower metal pattern 522 may be provided on the storage node contact BC on the cell edge region CER.

The first lower metal pattern 521 may fill a space between adjacent first bit lines BL1 in the first direction D1 and may extend onto an upper surface 341*s* of the first bit line capping pattern 341. An upper portion of the first lower metal pattern 521 may vertically overlap the first bit line BL1 and the first bit line capping pattern 341. When viewed in a plan view, an upper portion of the first lower metal pattern 521 may be shifted in the first direction D1 from the lower portion of the first lower metal pattern 521.

The second lower metal pattern 522 may fill between adjacent second bit lines BL2 in the first direction D1 and may extend onto an upper surface 342*s* of the second bit line capping pattern 342. An upper portion of the second lower metal pattern 522 may vertically overlap the second bit line BL2 and the second bit line capping pattern 342. When viewed in a plan view, an upper portion of the second lower metal pattern 522 may be shifted in the first direction D1 from the lower portion of the second lower metal pattern 522.

A first separation distance P1 between the upper surface 341*s* of the first bit line capping pattern 341 and an upper surface LP1*s* of the first landing pad LP1 in the third direction D3 may be greater than a second separation distance P2 between the upper surface 342*s* of the second bit line capping pattern 342 and an upper surface LP2*s* of the second landing pad LP2 in the third direction D3. The first separation distance P1 may be the same as the sum of a first distance T1 between the upper surface 341*s* of the first bit line capping pattern 341 and an upper surface of the first lower metal pattern 521 and a first thicknesses W1 of the first upper metal pattern 531. The second separation distance P2 may be the same as the sum of a second distance T2 between the upper surface 342*s* of the second bit line capping pattern 342 and an upper surface of the second lower metal pattern 522 and a second thicknesses W2 of the second upper metal pattern 532. The first distance T1 may mean a thickness of an upper portion of the first lower metal pattern 521. The second distance T2 may mean a thickness of an upper portion of the second lower metal pattern 522. The first distance T1 may be greater than the second distance T2. The first thickness W1 may be substantially the same as the second thickness W2. A difference between the first distance T1 and the second distance T2 may be greater than a difference between the first thickness W1 and the second thickness W2. A difference between the first separation distance P1 and the second separation distance P2 may be greater than 3 nm and less than or equal to 10 nm.

A third lower metal pattern 523 may be provided on the dummy storage node contact DBC and on a side surface of the dummy capping pattern 440. The third lower metal pattern 523 may include the same metal material as the first lower metal pattern 521 and the second lower metal pattern 522. According to some example embodiments, the third lower metal pattern 523 may not extend onto an upper surface of the dummy capping pattern 440.

A third upper metal pattern 533 may be provided on an upper surface of the dummy capping pattern 440. The third upper metal pattern 533 may be in contact with the upper surface of the dummy capping pattern 440. According to some example embodiments, the third lower metal pattern 523 and the third upper metal pattern 533 may be spaced apart from each other. The third upper metal pattern 533 may include the same metal material as the first and second upper metal patterns 531 and 532.

A second dummy ohmic pattern 410 may be interposed between the third lower metal pattern 523 and the dummy storage node contact DBC. According to some example embodiments, a second dummy barrier pattern may be interposed between the second dummy ohmic pattern 410 and the dummy storage node contact DBC. The second dummy ohmic pattern 410 may include the same material as the second ohmic pattern 310, and the second dummy barrier pattern may include the same material as the second barrier pattern.

A filling pattern LS may surround the landing pad LP. The filling pattern LS may be interposed between adjacent landing pads LP. When viewed in a plan view, the filling pattern LS may have a mesh shape including holes penetrated by the landing pads LP. For example, the filling pattern LS may include at least one of silicon nitride, silicon oxide, silicon oxynitride, or a combination thereof. As another example, the filling pattern LS may include an empty space (i.e., an air gap) including an air layer. The filling pattern LS may also be provided on the boundary region IR to separate the third lower metal pattern 523 and the third upper metal pattern 533.

A data storage pattern DS may be provided on the landing pad LP. The data storage pattern DS may be provided in plural, and the data storage patterns DS may be spaced apart from each other in the first and second directions D1 and D2. The data storage pattern DS may be connected to the corresponding second impurity region 112 through a corresponding landing pad LP and a corresponding storage node contact BC.

The data storage pattern DS may be, for example, a capacitor including a lower electrode, a dielectric layer, and an upper electrode. In this case, the semiconductor memory device according to the present disclosure may be a dynamic random access memory (DRAM). As another example, the data storage pattern DS may include a magnetic tunnel junction pattern. In this case, the semiconductor memory device according to the present disclosure may be a magnetic random access memory (MRAM). As another example, the data storage pattern DS may include a phase change material or a variable resistance material. In this case, the semiconductor memory device according to the present disclosure may be a phase-change random access memory (PRAM) or a resistive random access memory (ReRAM). However, there are only examples and example embodiments are not limited thereto, and the data storage pattern DS may include various structures and/or materials capable of storing data.

According to some example embodiments of the present disclosure, the first bit line BL1 on a cell center region CCR, the first bit line capping pattern 341 on the first bit line BL1, and the first landing pad LP1 vertically overlapping the first bit line capping pattern 341 may be provided. The first landing pad LP1 may include the first lower metal pattern 521 and the first upper metal pattern 531 on the first lower metal pattern 521. As will be described later, when a node separation to form the first landing pad LP1 is performed through an etching process, the first lower metal pattern 521 may be provided on the first bit line capping pattern 341, and thus a lowermost position where the first bit line capping pattern 341 is etched may be relatively far from the first bit line BL1. Thus, even when a metal residue is generated in the etching process, a distance between the metal residue and the first bit line BL1 may be secured, thereby mitigating or preventing a short circuit therebetween. Accordingly, reliability of the semiconductor memory device may be increased.

FIGS. 4A, 4B, 4C, 4D, 4E, 4F and 4G are cross-sectional views corresponding to lines A-A' of FIG. 2 and sequentially illustrating a method of manufacturing a semiconductor memory device according to an example embodiment.

Figure 4A:
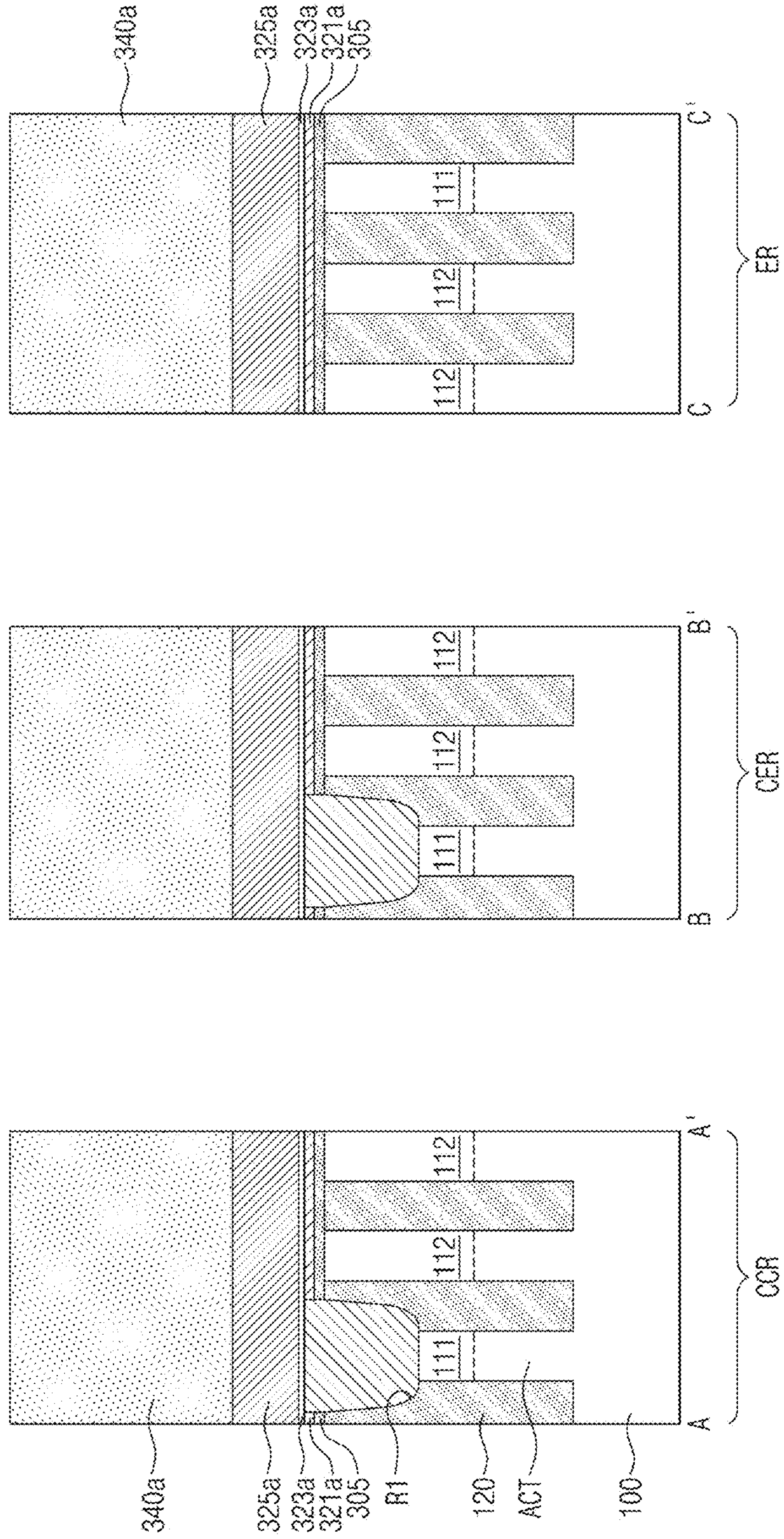
FIGS. 4A, 4B, 4C, 4D, 4E, 4F and 4G are cross-sectional views corresponding to line A-A' of FIG. 2 and sequentially illustrating a method of manufacturing a semiconductor memory device according to an example embodiment.

Referring to FIG. 4A, device isolation patterns 120 may be formed in a semiconductor substrate 100 to define cell active patterns ACT. For example, trenches may be formed in the semiconductor substrate 100 and the device isolation patterns 120 may fill the trenches, respectively. The semiconductor substrate 100 and the device isolation patterns 120 may be etched to form grooves, and a gate dielectric layer 107, word lines WL, and word line capping patterns 108 may be formed in the grooves (refer to FIG. 3B). Dopants may be implanted into the cell active patterns ACT using the word line capping patterns 108 and the device isolation pattern 120 as masks to form first impurity regions 111 and second impurity regions 112 (refer to FIG. 3B).

Thereafter, a buffer pattern 305 may be formed on the semiconductor substrate 100. A buffer layer may be formed on the semiconductor substrate 100 and may be patterned to form the buffer pattern 305. The device isolation pattern 120, the semiconductor substrate 100, and the word line capping patterns 108 on the cell center region CCR and the cell edge region CER may be etched using the buffer pattern 305 as an etch mask. Thus, a first recess region R1 may be formed. The first recess region R1 may expose the first impurity regions 111.

Referring to FIG. 4A a polysilicon layer 321*a*, a first ohmic layer 323*a*, a metal-containing layer 325*a*, and a capping layer 340*a* may be formed on the semiconductor substrate 100.

Figure 4B:
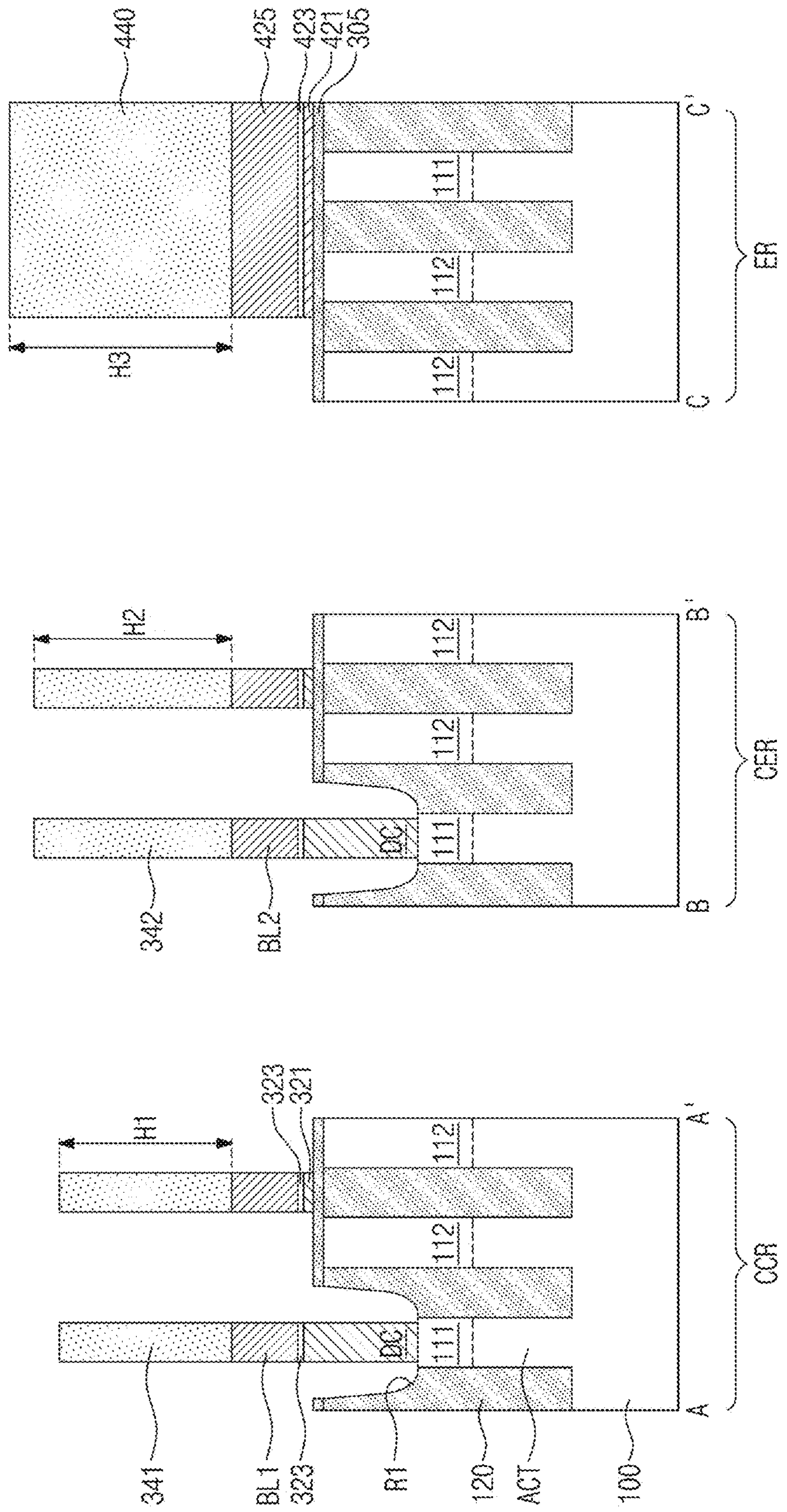

Referring to FIG. 4B, a mask pattern (not shown) defining planar shapes of a first bit line BL1 on the cell center region CCR and a second bit line BL2 on the cell edge region CER may be formed on the capping layer 340*a* of FIG. 4A.

A first bit line capping pattern 341, a second bit line capping pattern 342, bit lines BL1 and BL2, a first ohmic pattern 323, a polysilicon pattern 321, and a bit line contact DC on the cell center region CCR and the cell edge region CER may be formed by using the mask pattern as an etch mask. At the same time, a dummy capping pattern 440, a dummy metal-containing pattern 425, a dummy ohmic pattern 423, and a dummy polysilicon pattern 421 on the boundary region IR may be formed by using the mask pattern as an etch mask. Through the etching process, an upper surface of the buffer pattern 305 and an inner wall and bottom surface of the first recess region R1 may be partially exposed.

The boundary region IR may be protected by the mask pattern, and thus etching affect may be relatively small compared to the cell region CR. The cell edge region CER may be disposed adjacent to the boundary region IR, and thus etching affect may be relatively small compared to the cell center region CCR. For example, as the amount of etchant introduced into the cell edge region CER is limited rather than the cell center region CCR, etch reaction in the cell edge region CER may be limited. A capping layer 340*a* on the cell center region CCR may be etched faster than a capping layer 340*a* on the cell edge region CER. Thus, a first height H1 of the first bit line capping pattern 341 may be formed smaller than a second height H2 of the second bit line capping pattern 342 and a third height H3 of the dummy capping pattern 440.

Figure 4C:
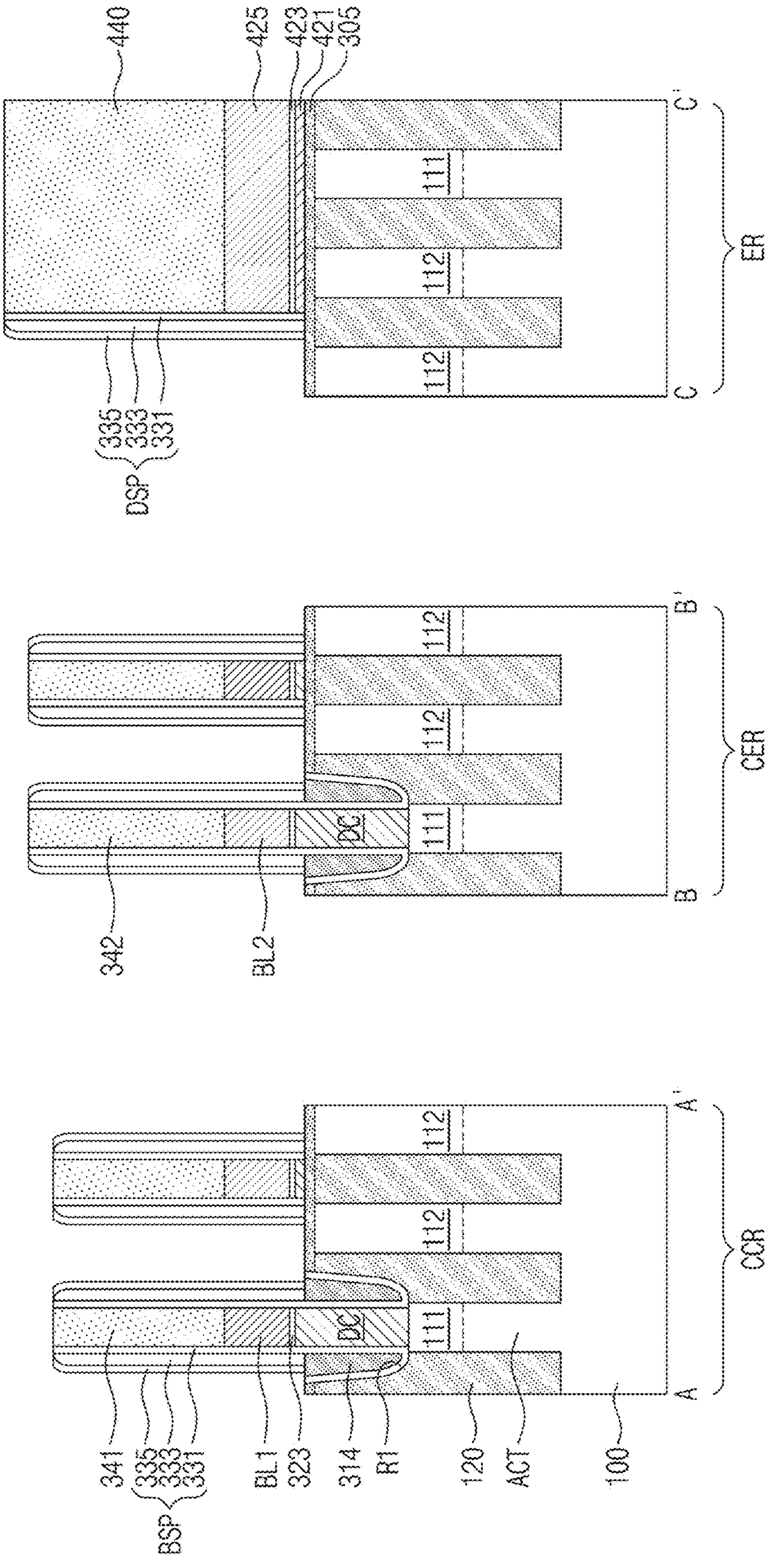

Referring to FIG. 4C, a first sub-spacer layer may be conformally formed on an upper surface of the semiconductor substrate 100. The first sub-spacer layer may conformally cover the inner wall and the bottom surface of the first recess region R1. The first sub-spacer layer may cover side surfaces of the bit line BL, the first bit line capping pattern 341, the second bit line capping pattern 342, the dummy metal-containing pattern 425, and the dummy capping pattern 440.

Subsequently, a buried insulating layer may be deposited on the first sub-spacer layer to fill the first recess region R1. The buried insulating layer may be formed on the first sub-spacer layer to fill the first recess region R1. Subsequently, an anisotropic etching process may be performed on the buried insulating layer and the first sub-spacer layer to form a buried insulating pattern 314 and a first sub-spacer 331, respectively.

A second sub-spacer layer may be conformally formed on the first sub-spacer 331 and etched back to form a second sub-spacer 333 covering a sidewall of the first sub-spacer 331. A third sub-spacer layer may be conformally formed on the entire surface of the semiconductor substrate 100 and then etched back to form a third sub-spacer 335 covering sidewalls of the second sub-spacer 333. Accordingly, a bit line spacer BSP and a dummy spacer DSP may be formed. After forming the third sub-spacer 335, an upper surface of the buffer pattern 305 may be exposed.

Figure 4D:
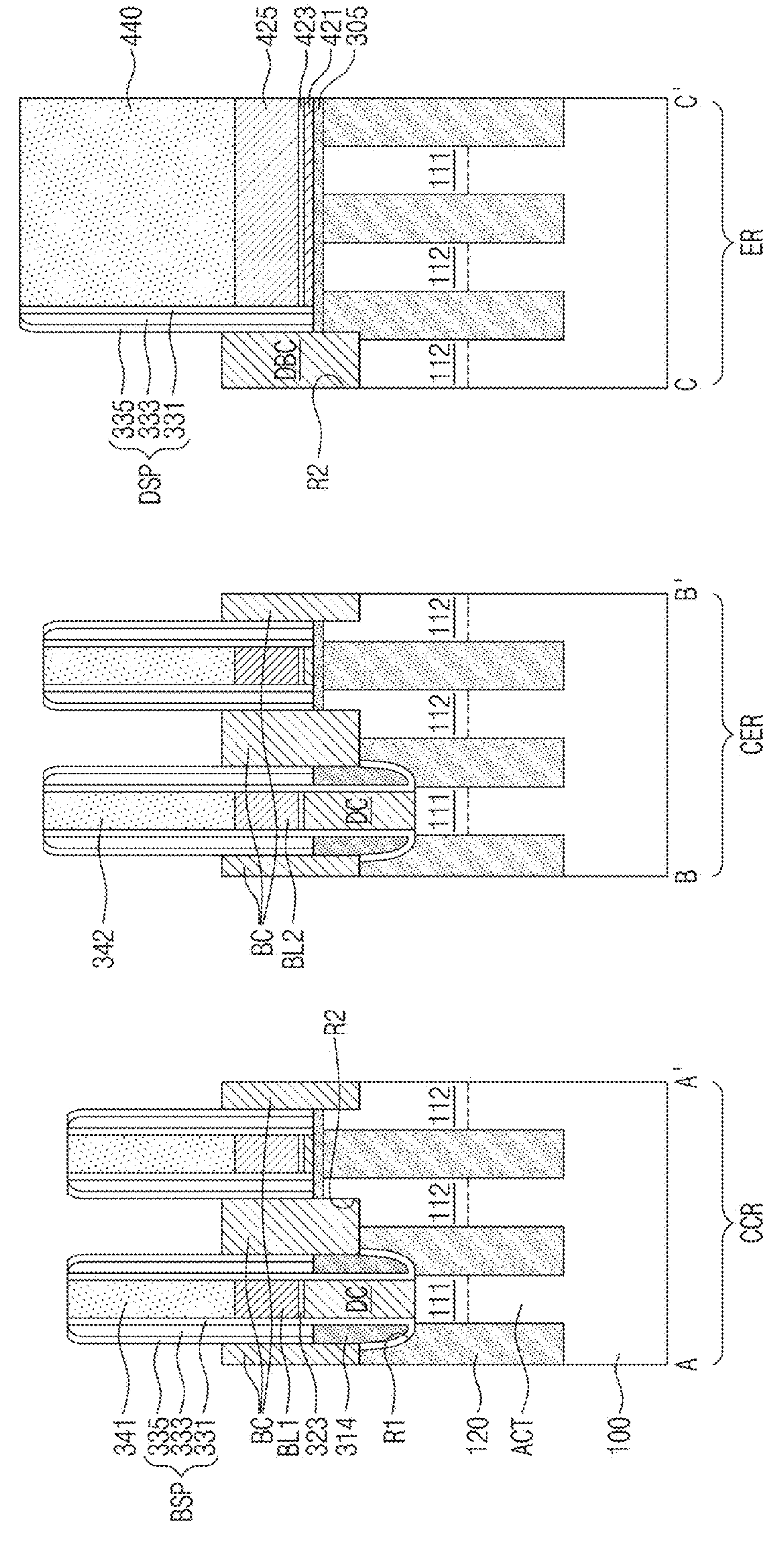

Referring to FIG. 4D, a second recess region R2 may be formed in the active pattern AP of the semiconductor substrate 100. A polysilicon layer may be deposited to fill the second recess region R2, a space between the bit lines BL, and a space between the bit line BL and the dummy metal-containing pattern 425, and then etched to form a storage node contact BC and a dummy storage node contact DBC.

Figure 4E:
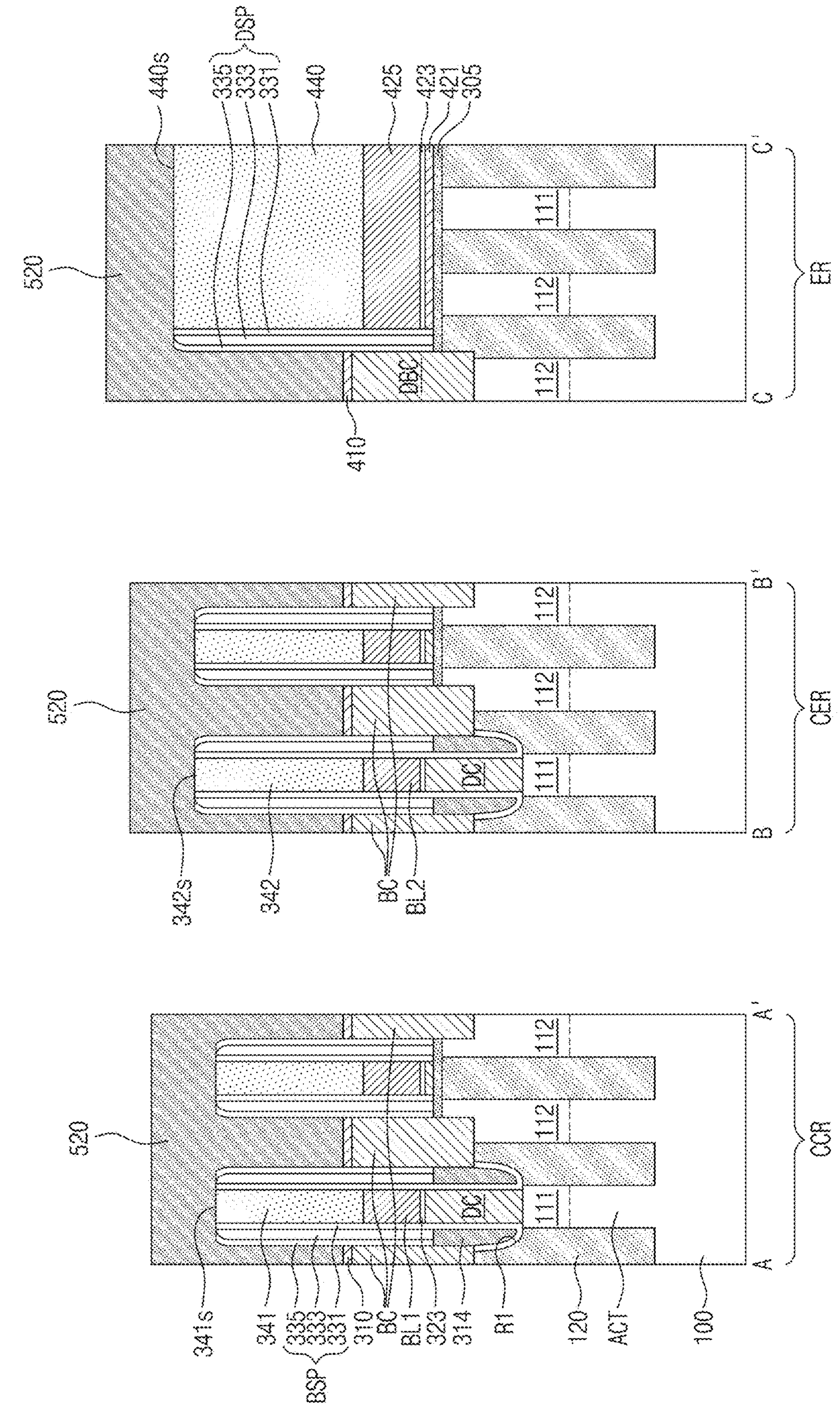

Referring to FIG. 4E, a second ohmic pattern 310 may be formed on the storage node contact BC, and a second dummy ohmic pattern 410 may be formed on each of the dummy storage node contacts DBC. According to some example embodiments, a second barrier pattern and a second dummy barrier pattern may be formed before forming the second ohmic pattern 310 and the second dummy ohmic pattern 410.

A lower metal layer 520 covering the entire surface of the semiconductor substrate 100 may be formed. The lower metal layer 520 may fill between the bit line capping patterns 341 and 342 and between the second bit line capping pattern 342 and the dummy capping pattern 440, and may be cover upper surfaces of the bit line capping patterns 341 and 342 and an upper surface of the dummy capping pattern 440. The lower metal layer 520 may include titanium (Ti) or titanium (Ti) and titanium nitride (TiN). A level of an upper surface of the lower metal layer 520 on the cell center region CCR, the cell edge region CER, and the boundary region IR may become higher from the cell center region CCR to the boundary region IR.

Figure 4F:
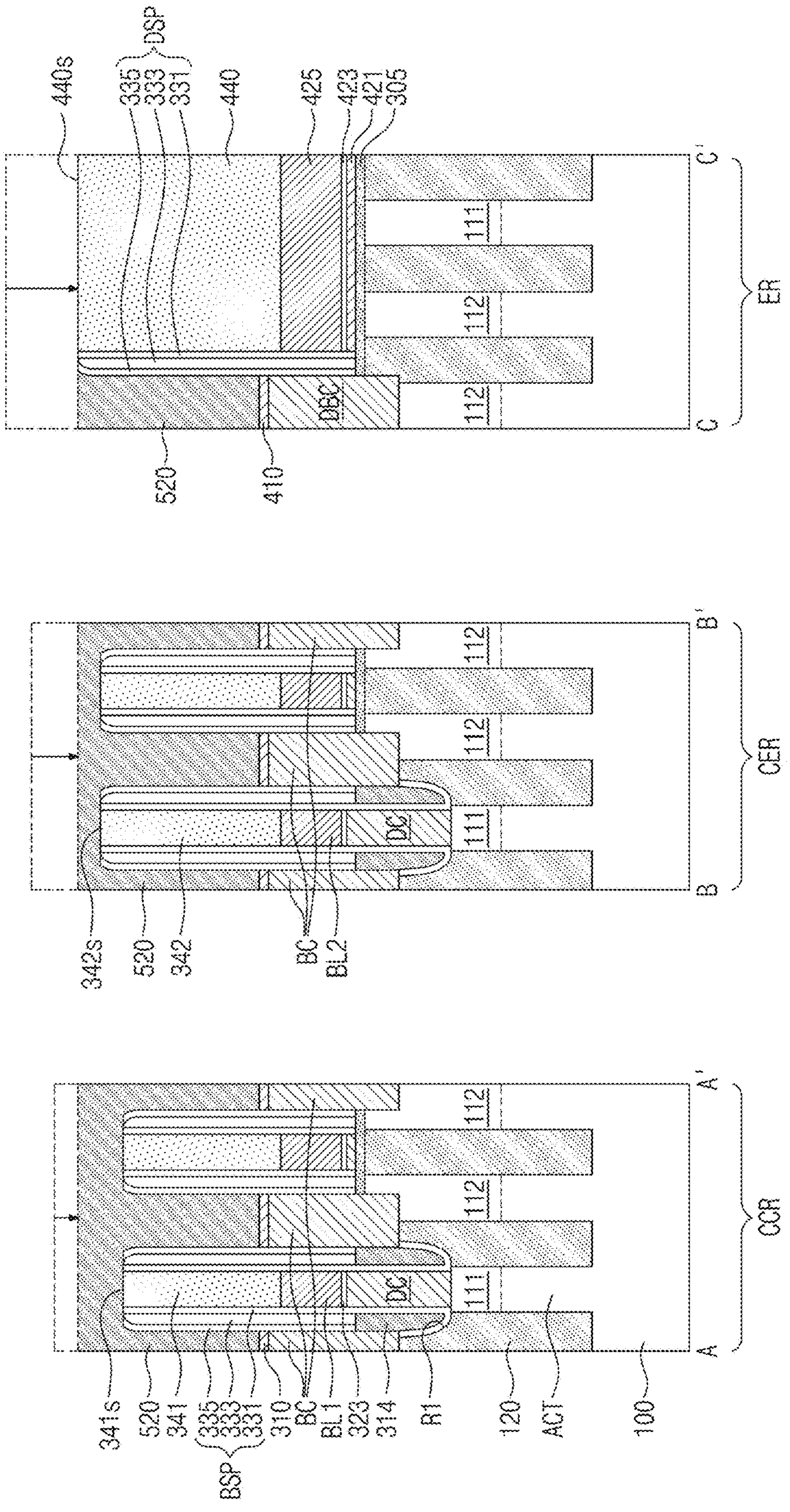

Referring to FIG. 4F, a planarization process using a non-selective ratio slurry may be performed on the entire surface of the semiconductor substrate 100. The planarization process may be performed until an upper surface 440*s* of the dummy capping pattern 440 is exposed. In this process, portions of the lower metal layer 520 on the cell center region CCR, the lower metal layer 520 on the cell edge region CER, and the lower metal layer 520 on the boundary region IR may be removed. An upper surface 341*s* of the first bit line capping pattern 341 and an upper surface 342*s* of the second bit line capping pattern 342 may be still covered by the lower metal layer 520 and may not be exposed. Due to the planarization process, a step between the memory cell region CR and the boundary region IR may be less than 3 nm.

Figure 4G:
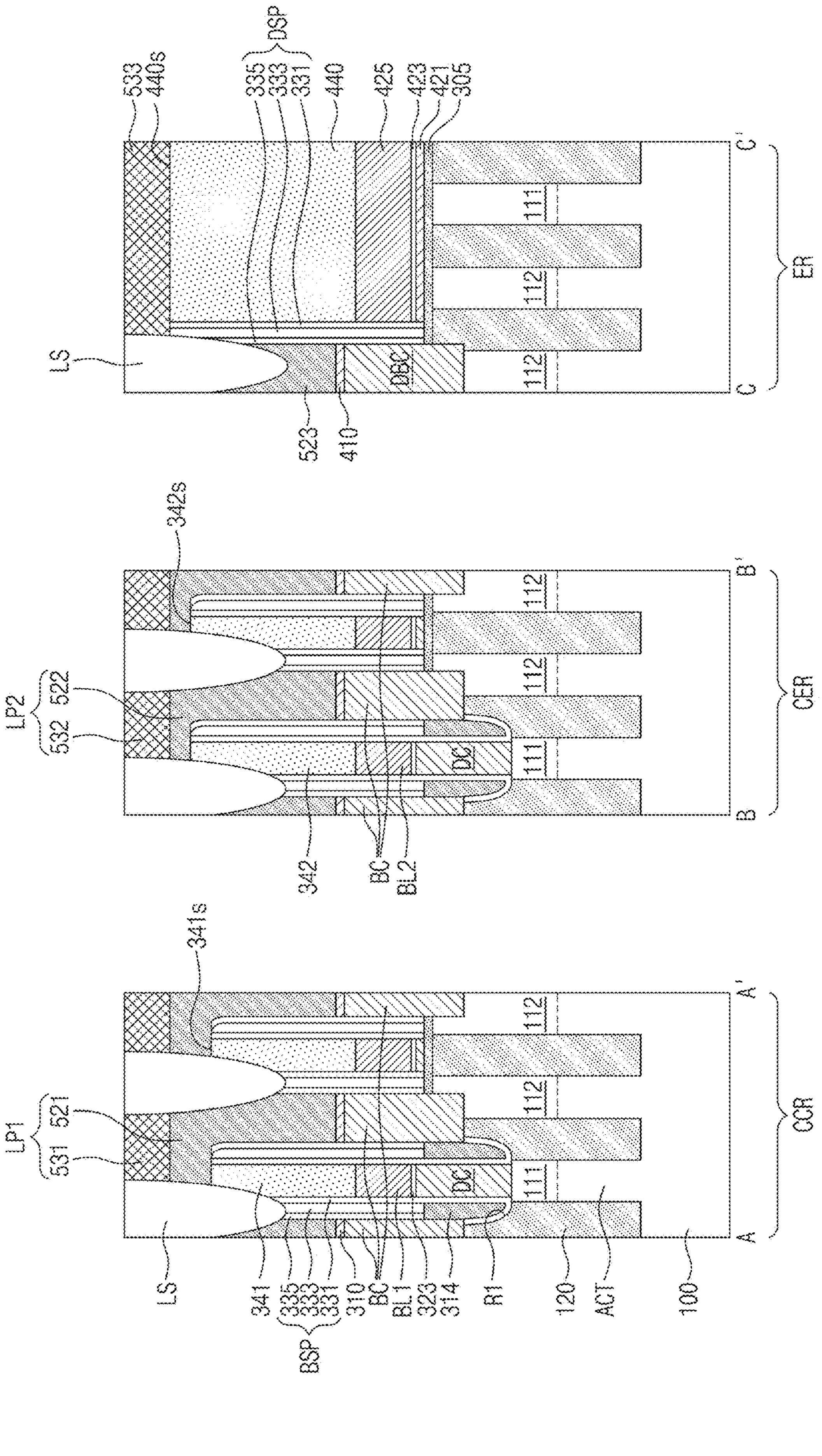

Referring to FIGS. 4F and 4G, an upper metal layer may be formed on the lower metal layer 520 of the cell region CR and on the dummy capping pattern 440 of the boundary region IR. The upper metal layer may include tungsten. Next, the upper metal layer, the lower metal layer 520, the bit line spacer BSP, the dummy spacer DSP, the first bit line capping pattern 341, the second bit line capping pattern 342, and the dummy capping pattern 440 may be etched. Through the etching process, a first upper metal pattern 531, a second upper metal pattern 532, and a third upper metal pattern 533 separated from each other may be formed from the upper metal layer. In addition, by the etching process, a first lower metal pattern 521, a second lower metal pattern 522, and a third lower metal pattern 523 separated from each other may be formed from the lower metal layer. Thus, first landing pads LP1 and second landing pads LP2 which are node-separated from each other may be formed.

Subsequently, a filling pattern LS may fill a space between the first landing pads LP1, to fill a space between the second landing pads LP2, to fill a space between the first and second landing pads LP1 and LP2, and to fill a space between the second landing pad and the third upper metal pattern 533. Data storage patterns DS may be formed on the landing pads LP.

Figure 5A:
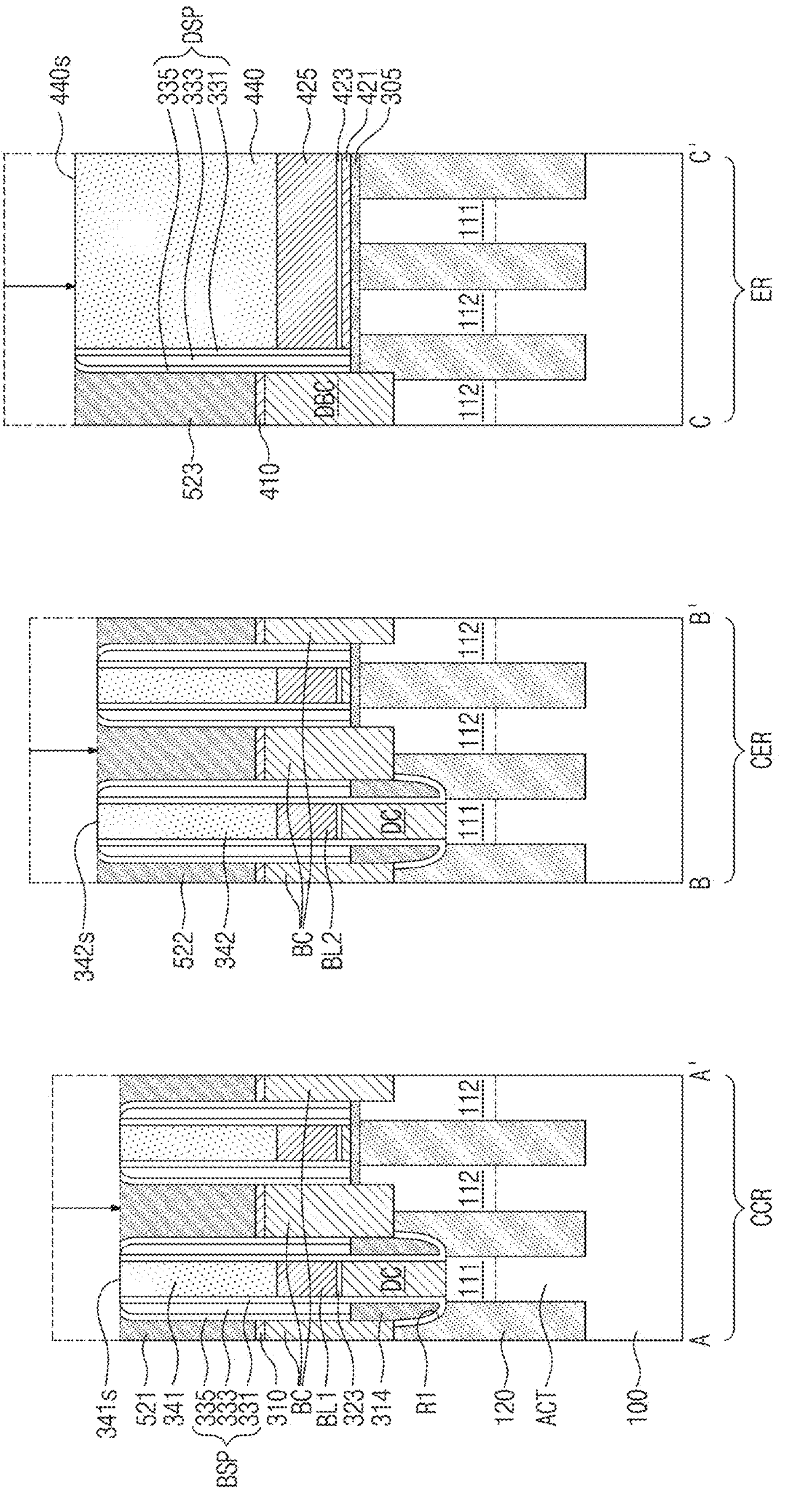
FIGS. 5A, 5B, and 5C are cross-sectional views corresponding to line A-A' of FIG. 2 and sequentially illustrating a method of manufacturing a semiconductor memory device according to a comparative example.
Figure 5B:
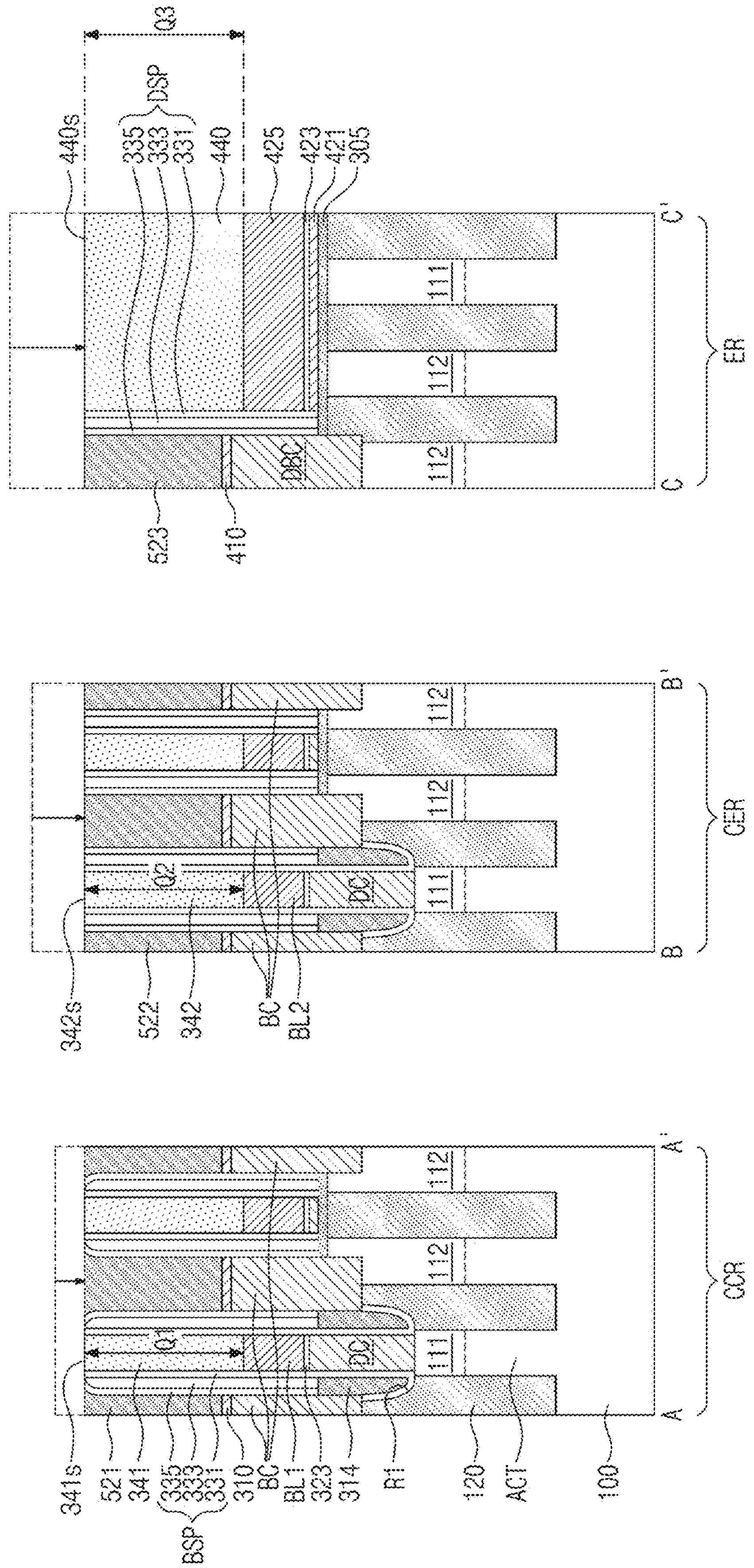
Figure 5C:
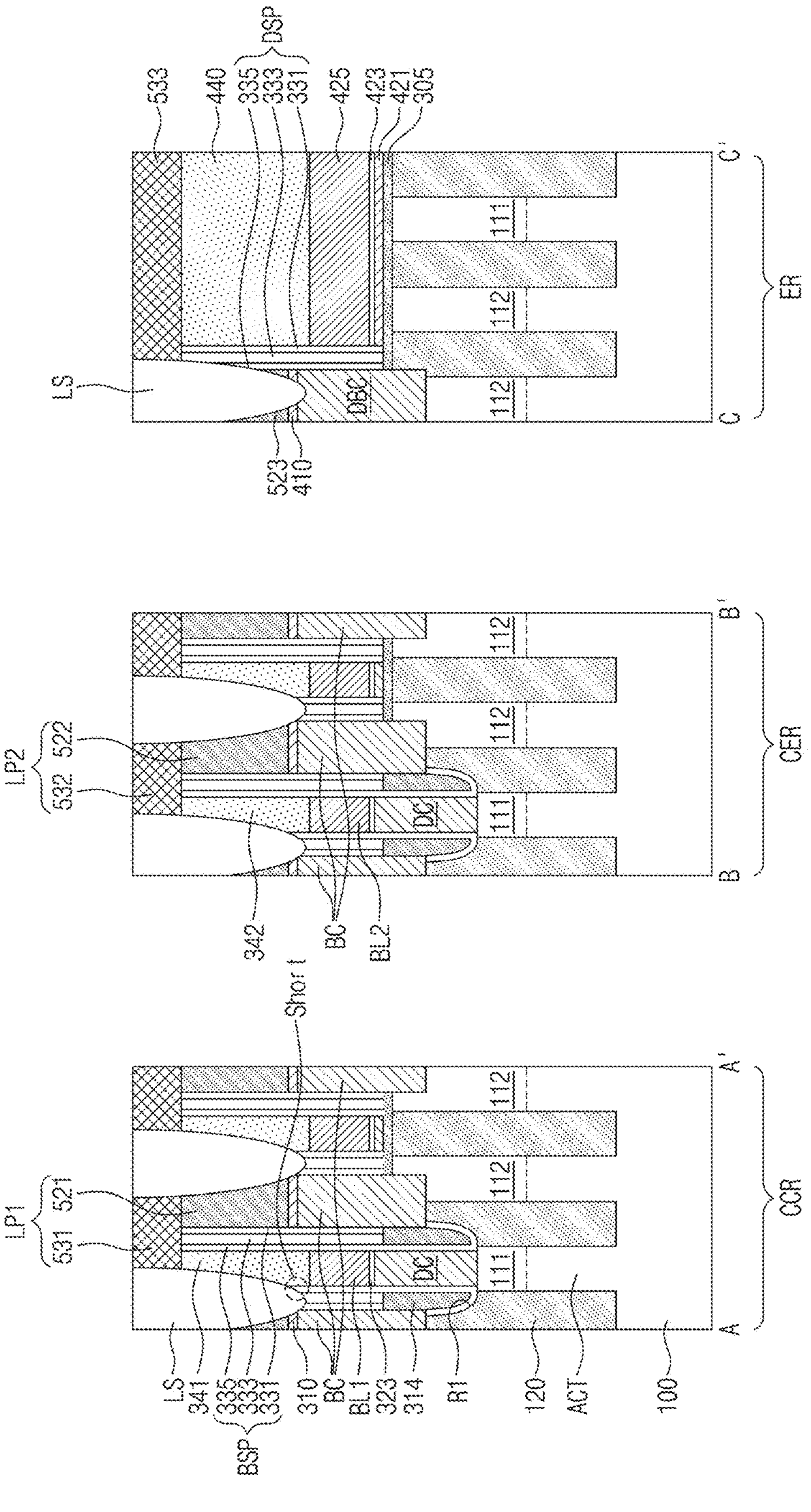

FIGS. 5A, 5B, and 5C are cross-sectional views corresponding to lines A-A' of FIG. 2 and sequentially illustrating a method of manufacturing a semiconductor memory device according to a comparative example.

Referring to FIGS. 4E and 5A, a planarization process using a high selectivity slurry may be performed on the entire surface of the semiconductor substrate 100. As the high selectivity slurry proceeds, the lower metal layer 520 may be selectively removed. The process of removing the lower metal layer 520 may be performed until the upper surface 341*s* of the first bit line capping pattern 341 on the cell center region CCR is exposed. The upper surface 341*s* of the first bit line capping pattern 341, the upper surface 342*s* of the second bit line capping pattern 342, and the upper surface 440*s* of the dummy capping pattern 440 may all be exposed. Through the planarization process, the first lower metal pattern 521, the second lower metal pattern 522, and the third lower metal pattern 523 separated from each other may be formed from the lower metal layer 520.

Referring to FIG. 5B, a planarization process using a non-selective ratio slurry may be performed on the entire surface of the semiconductor substrate 100. Thus, a level difference between the cell region CR and the peripheral region PR may decrease. In the planarization process, a height Q1 of the first bit line capping pattern 341, a height Q2 of the second bit line capping pattern 342, and a height Q3 of the dummy capping pattern 440 may decrease, respectively. For example, each of the heights of the first bit line capping pattern 341, the second bit line capping pattern 342, and the dummy capping pattern 440 may decrease by about 10 nm. By the planarization process, the height Q1 of the first bit line capping pattern 341, the height Q2 of the second bit line capping pattern 342, and the height Q3 of the dummy capping pattern 440 may substantially equal to each other. In some example embodiments, the height Q2 of the second bit line capping pattern 342 may be greater than the height Q1 of the first bit line capping pattern 341, and the height Q3 of the dummy capping pattern 440 may be greater than the height Q2 of the second bit line capping pattern 340, but a difference between the heights may be less than 5 nm.

Referring to FIG. 5C, an upper metal layer may be formed on the first lower metal pattern 521, the second lower metal pattern 522, the third lower metal pattern 523, the first bit line capping pattern 341, the second bit line capping pattern 342, and the dummy capping pattern 440. The upper metal layer may be in direct contact with the first bit line capping pattern 341 and the second bit line capping pattern 342 and the dummy capping pattern 440. Subsequently, the upper metal layer, the first lower metal pattern 521, the second lower metal pattern 522, the third lower metal pattern 523, the bit line spacer BSP, the dummy spacer DSP, the first bit line capping pattern 341, the second bit line capping pattern 342, and the dummy capping pattern 440 may be etched.

After the etching process is performed, a metal residue may exist in a hole filled with the filling pattern LS. Because the height of the first bit line capping pattern 341 decrease by the planarization process of FIG. 5B, a distance between the metal residue and the bit line BL may be closer compared to the embodiment of the present disclosure. Thus, a short or a bridge may occur between the storage node contact BC and the first bit line through the metal residue.

According to some example embodiments of the present disclosure, unlike the comparative example, when forming the landing pad, after forming the lower metal layer, the height of the lower metal layer decreases to a position higher than the upper surface of the first bit line capping pattern. Thus, the step difference between the memory cell region and the peripheral region may be reduced while reducing or preventing the height of the first bit line capping pattern from decreasing. Subsequently, after forming the upper metal layer, the node separation is performed while the landing pads are formed through the etching process. Accordingly, when the metal etch residue exists, the distance sufficient to reduce or prevent the short circuit may be secured between the metal residue and the bit line BL. In addition, compared to the comparative example, the planarization process using the high selectivity slurry is omitted, and thus there is an advantage in terms of the process.

According to some example embodiment of the present disclosure, the bit line, the bit line capping pattern on the bit line, and the landing pad vertically overlapping the bit line capping pattern may be provided on the cell center region. The landing pad may include the lower metal pattern and the upper metal pattern on the lower metal pattern. When the node separation for forming the landing pad is performed through an etching process, the lower metal pattern may be provided on the bit line capping pattern, and thus the lowermost position where the bit line capping pattern is etched may be relatively far from the bit line. Thus, even when the metal residue is generated in the etching process, the distance between the metal residue and the bit line to reduce or prevent the short circuit may be secured. Accordingly, reliability of the semiconductor memory device may be increased.

While some example embodiments are described above, a person skilled in the art may understand that many modifications and variations are made without departing from the spirit and scope of the present disclosure defined in the following claims. Accordingly, the disclosed example embodiments of the present disclosure should be considered in all respects as illustrative and not restrictive, with the spirit and scope of the present disclosure being indicated by the appended claims.

What is claimed is:

1. A semiconductor memory device comprising:
- a substrate including a memory cell region, the memory cell region including a cell center region and a cell edge region surrounding the cell center region;
- a first bit line on the cell center region;
- a first landing pad on the first bit line;
- a first bit line capping pattern between the first bit line and the first landing pad;
- a second bit line on the cell edge region;
- a second landing pad on the second bit line; and
- a second bit line capping pattern between the second bit line and the second landing pad, wherein
- the first bit line capping pattern vertically overlaps the first landing pad,
- the second bit line capping pattern vertically overlaps the second landing pad, and
- a first distance from an upper surface of the first bit line capping pattern to an upper surface of the first landing pad is greater than a second distance from an upper surface of the second bit line capping pattern to an upper surface of the second landing pad.

2. The semiconductor memory device of claim 1, wherein a difference between the first distance and the second distance is greater than 3 nm and less than or equal to 10 nm.

3. The semiconductor memory device of claim 1, wherein a height of the first bit line capping pattern is smaller than a height of the second bit line capping pattern.

4. The semiconductor memory device of claim 1, wherein
- the first landing pad includes,
  - a first lower metal pattern, and
  - a first upper metal pattern on the first lower metal pattern,
- the second landing pad includes,
  - a second lower metal pattern, and
  - a second upper metal pattern on the second lower metal pattern,
- the first lower metal pattern and the second lower metal pattern include a first metal material,
- the second lower metal pattern and the second upper metal pattern include a second metal material, and
- the first metal material and the second metal material are different from each other.

5. The semiconductor memory device of claim 4, wherein
- the first metal material includes titanium (Ti) or titanium (Ti) and titanium nitride (TiN), and
- the second metal material includes tungsten.

6. The semiconductor memory device of claim 4, further comprising:
- a plurality of first bit lines including the first bit line; and
- a first storage node contact between a corresponding pair of the plurality of first bit lines, wherein
- the first lower metal pattern is on the first storage node contact and extends onto an upper surface of the first bit line capping pattern.

7. The semiconductor memory device of claim 4, further comprising:
- a plurality of first bit lines spaced apart from each other in a first direction, the plurality of first bit lines including the first bit line,
- wherein an upper portion of the first lower metal pattern has a shape shifted from a lower portion of the first lower metal pattern in the first direction, when viewed in a plan view.

8. The semiconductor memory device of claim 1, wherein each of the first bit line capping pattern and the second bit line capping pattern includes silicon nitride (SiN).

9. A semiconductor memory device comprising:
a substrate including a memory cell region, the memory cell region including a cell center region and a cell edge region surrounding the cell center region;
a first bit line on the cell center region;
a first landing pad on the first bit line;
a first bit line capping pattern between the first bit line and the first landing pad;
a second bit line on the cell edge region;
a second landing pad on the second bit line; and
a second bit line capping pattern between the second bit line and the second landing pad, wherein
the first landing pad includes a first lower metal pattern and a first upper metal pattern on the first lower metal pattern,
the second landing pad includes a second lower metal pattern and a second upper metal pattern on the second lower metal pattern,
an upper portion of the first lower metal pattern vertically overlaps the first bit line capping pattern,
an upper portion of the second lower metal pattern vertically overlaps the second bit line capping pattern, and
a first thickness of the upper portion of the first lower metal pattern is greater than a second thickness of the upper portion of the second lower metal pattern.

10. The semiconductor memory device of claim 9, wherein
the first lower metal pattern and the second lower metal pattern include a first metal material,
the first upper metal pattern and the second upper metal pattern include a second metal material,
the first metal material includes titanium (Ti) or titanium (Ti) and titanium nitride (TiN), and
the second metal material includes tungsten.

11. The semiconductor memory device of claim 9, further comprising:
a first storage node contact on a lower portion of the first lower metal pattern;
a first ohmic pattern between the first lower metal pattern and the first storage node contact;
a second storage node contact on a lower portion of the second lower metal pattern; and
a second ohmic pattern between the second lower metal pattern and the second storage node contact, wherein
the first lower metal pattern is in contact with the first ohmic pattern,
the second lower metal pattern is in contact with the second ohmic pattern, and
each of the first ohmic pattern and the second ohmic pattern includes a metal silicide.

12. The semiconductor memory device of claim 9, wherein each of the first bit line capping pattern and the second bit line capping pattern includes silicon nitride (SiN).

13. The semiconductor memory device of claim 9, wherein a height of the first bit line capping pattern is smaller than a height of the second bit line capping pattern.

14. The semiconductor memory device of claim 9, wherein a distance from an upper surface of the first bit line capping pattern to the first upper metal pattern is greater than a distance from an upper surface of the second bit line capping pattern to the second upper metal pattern.

15. The semiconductor memory device of claim 9, wherein
the first lower metal pattern is in contact with the first upper metal pattern, and
the second lower metal pattern is in contact with the second upper metal pattern.

16. A semiconductor memory device comprising:
a substrate including a memory cell region, a peripheral region, and a boundary region, the memory cell region including a cell center region and a cell edge region surrounding the cell center region, the peripheral region surrounding the memory cell region, and the boundary region being between the peripheral region and the cell edge region;
a first bit line on the cell center region;
a first landing pad on the first bit line, the first landing pad including a first lower metal pattern and a first upper metal pattern on the first lower metal pattern;
a first bit line capping pattern between the first bit line and the first landing pad;
a second bit line on the cell edge region;
a second landing pad on the second bit line, the second landing pad including a second lower metal pattern and a second upper metal pattern on the second lower metal pattern;
a second bit line capping pattern between the second bit line and the second landing pad;
a dummy metal-containing pattern on the boundary region;
a dummy capping pattern on the dummy metal-containing pattern;
a third lower metal pattern on a side surface of the dummy capping pattern; and
a third upper metal pattern on an upper surface of the dummy capping pattern, wherein
the first upper metal pattern, the second upper metal pattern, and the third upper metal pattern include a same metal material,
the first upper metal pattern is vertically spaced apart from the first bit line capping pattern with the first lower metal pattern interposed therebetween,
the second upper metal pattern is vertically spaced apart from the second bit line capping pattern with the second lower metal pattern interposed therebetween, and
the third upper metal pattern is in contact with the dummy capping pattern.

17. The semiconductor memory device of claim 16, wherein
the first bit line capping pattern, the second bit line capping pattern, and the dummy capping pattern include a same insulating material,
a height of the dummy capping pattern is greater than a height of the second bit line capping pattern, and
the height of the second bit line capping pattern is greater than a height of the first bit line capping pattern.

18. The semiconductor memory device of claim 16, wherein a separation distance between an upper surface of the first upper metal pattern and an upper surface of the first bit line capping pattern is greater than a separation distance between an upper surface of the second upper metal pattern and an upper surface of the second bit line capping pattern.

19. The semiconductor memory device of claim 16, wherein
an upper portion of the first lower metal pattern vertically overlaps the first bit line capping pattern,
an upper portion of the second lower metal pattern vertically overlaps the second bit line capping pattern, and
a difference between a thickness of the upper portion of the first lower metal pattern and a thickness of the upper portion of the second lower metal pattern is greater than a difference between a thickness of the first upper metal pattern and a thickness of the second upper metal pattern.

20. The semiconductor memory device of claim 16, wherein the first lower metal pattern is in contact with the first upper metal pattern, the second lower metal pattern is in contact with the second upper metal pattern, and the third lower metal pattern is spaced apart from the third upper metal pattern.

* * * * *